United States Patent [19]

Ishii

[11] Patent Number: 4,626,715
[45] Date of Patent: Dec. 2, 1986

[54] MOS FET AMPLIFIER OUTPUT STAGE

[75] Inventor: Satoshi Ishii, Tokyo, Japan

[73] Assignee: Pioneer Electronic Corporation, Tokyo, Japan

[21] Appl. No.: 584,290

[22] Filed: Feb. 28, 1984

[30] Foreign Application Priority Data

Feb. 28, 1983 [JP] Japan ................................. 58-33497

[51] Int. Cl.⁴ ..................... H03K 17/687; H03K 5/00; H03K 3/01
[52] U.S. Cl. .................................. 307/585; 307/254; 307/571; 307/561; 307/270; 307/542
[58] Field of Search ............... 307/571, 585, 572–575, 307/540, 542, 546–548, 551, 561, 565, 448, 300, 304, 270, 255, 254, 200 B

[56] References Cited

U.S. PATENT DOCUMENTS

| | | | |
|---|---|---|---|
| 3,219,839 | 11/1965 | Fletcher | 307/561 |
| 4,066,918 | 1/1978 | Heuner et al. | 307/304 |
| 4,156,153 | 5/1979 | Szechenyi | 307/585 |
| 4,313,065 | 1/1982 | Yoshida et al. | 307/570 |
| 4,426,589 | 1/1984 | Möder | 307/270 |
| 4,556,808 | 12/1985 | Coats | 307/571 |

Primary Examiner—Stanley D. Miller
Assistant Examiner—Timothy P. Callahan
Attorney, Agent, or Firm—Sughrue, Mion, Zinn, Macpeak, and Seas

[57] ABSTRACT

An output circuit particularly adapted for use in a pulse width modulation amplifier having a significantly reduced power loss during switching times. Inductors are coupled in series with the signal channels of two push-pull connected switching elements. High-speed diodes are coupled in parallel with the series combinations of switching elements and inductors.

5 Claims, 17 Drawing Figures

FIG. 1
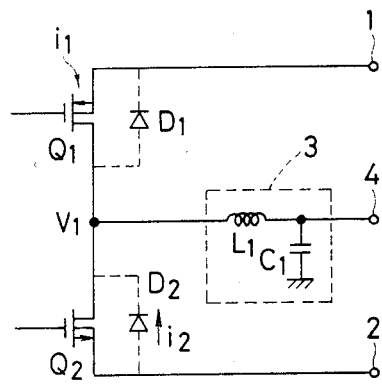
FIG. 2
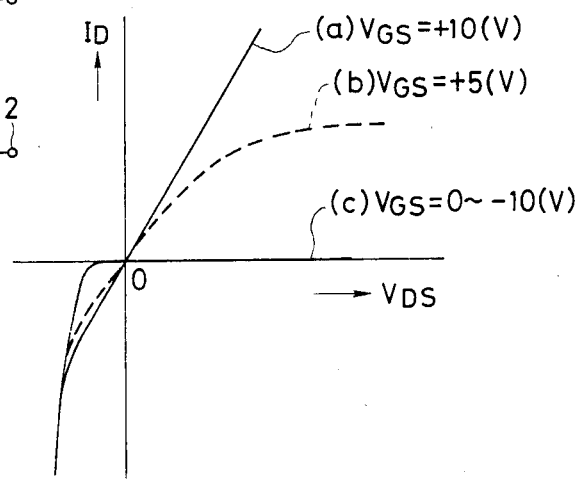
FIG. 3A
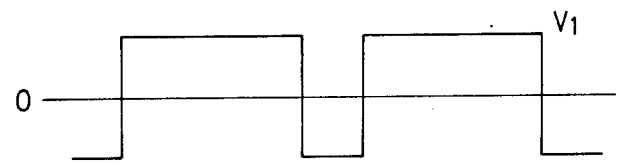
FIG. 3B
FIG. 3C
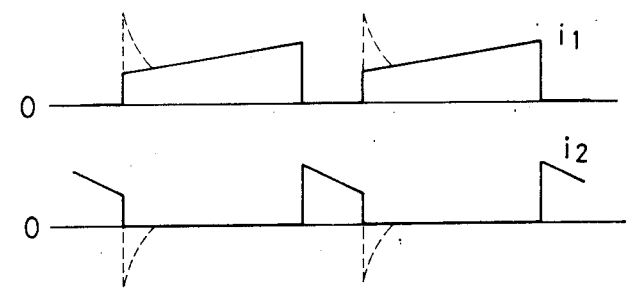

CARRIER FREQUENCY 300 KHz
FREQUENCY TO BE MODULATED 1 KHz

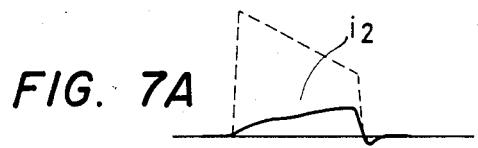
FIG. 7A
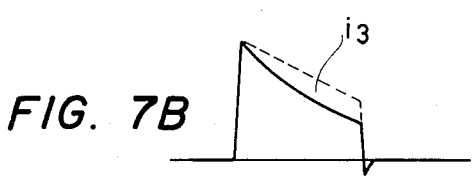
FIG. 7B
FIG. 8
CARRIER FREQUENCY 300 KHz
FREQUENCY TO BE MODULATED 1 KHz
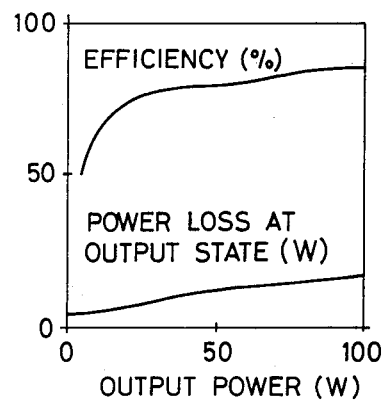
FIG. 9
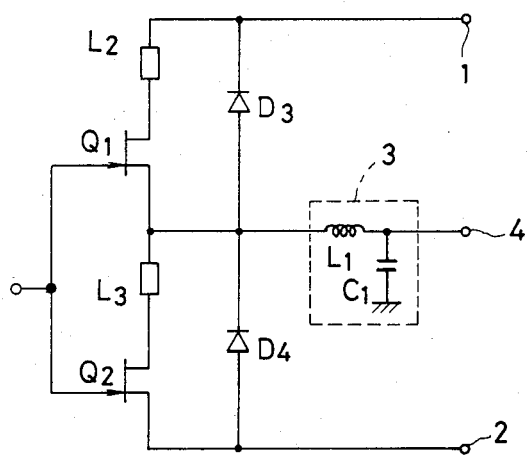

MOS FET AMPLIFIER OUTPUT STAGE

BACKGROUND OF THE INVENTION

The invention relates to an output circuit driven by a switching element such as a power amplifier employing a pulse width modulation technique. More particularly, the invention pertains to such an output circuit in which the power loss which occurs during switching times of the semiconductor devices of which the stage is formed is minimized.

FIG. 1 is a schematic diagram of an output circuit of a conventional power amplifier of the type employing pulse width modulation. In the circuit shown in FIG. 1, complementary MOS FETs $Q_1$ and $Q_2$ have signal channels connected in series with one another between positive and negative power source terminals 1 and 2, respectively. Input signals are applied to the gates of the two MOS FETs. In a common application, both gates receive a common input signal. The juncture point of the transistors $Q_1$ and $Q_2$ is connected to a low-pass filter 3 composed of an inductor $L_1$ and a capacitor $C_1$. The output from the low-pass filter 3 is coupled to a final output terminal 4.

As indicated by dotted lines in FIG. 1, the MOS FETs $Q_1$ and $Q_2$ inherently include diodes $D_1$ and $D_2$. Referring to FIG. 2, characteristics of a typical N-channel power MOS FET are shown. The drain-source voltage $V_{DS}$ is plotted on the abscissa and the drain current $I_D$ on the ordinate. The gate-to-source voltage $V_{GS}$ is employed as a parameter, with each curve shown in FIG. 2 corresponding to a particular indicated value of $V_{GS}$. In these characteristic curves, the diode operation is indicated by the negative region of $V_{DS}$.

As described with reference to FIG. 1, in a conventional pulse width modulation power amplifier, it has been the practice to employ a low-pass filter composed of an inductor and a capacitor in the output stage of the amplifier to eliminate the carrier frequency. However, the inductor in this filter produces a reverse current which must be suppressed. Diodes $D_1$ and $D_2$ which perform this suppressing function are provided by the MOS FETs $Q_1$ and $Q_2$. This provides a very simple circuit construction in that it is not necessary to employ separate diodes. However, the diodes $D_1$ and $D_2$ inherently included in the structure of the MOS FETs $Q_1$ and $Q_2$ have a long reverse recovery time, which is accompanied by certain disadvantages.

More specifically, it is assumed that the voltage at the juncture point of the MOS FETs $Q_1$ and $Q_2$ is a voltage $V_1$ as shown in FIG. 3A. The forward current $i_1$ to the MOS FET $Q_1$ is shown in FIG. 3B, and forward current $i_2$ to the diode $Q_2$ is shown in FIG. 3C. Ideal waveforms are indicated by solid lines in FIGS. 3B and 3C. However, due to the fact that the diodes $D_1$ and $D_2$ have a long reverse recovery time, typically, several hundred nanoseconds, the current $i_1$ and $i_2$ actually appear as shown by the dashed lines in FIGS. 3B and 3C. The presence of these spikes in the waveforms of $i_1$ and $i_2$ results in a large power loss at the time of switching. Typically, about 60 to 70% of the total power loss in the output stage is a result of such losses. FIG. 4 graphically shows the output power, power loss in the output stage, and the efficiency of the circuit of FIG. 1.

In view of the above, it is a primary object of the present invention to provide a pulse width modulation power amplifier output stage having a significantly improved efficiency.

More specifically, it is an object of the present invention to provide a pulse width modulation power amplifier employing power MOS FETs in which power losses due to switching are greatly reduced.

SUMMARY OF THE INVENTION

The above and other objects of the invention are met by an output stage for a pulse width modulation amplifier employing power MOS FETs in which diodes, which are separate from the inherent diodes of the MOS FETs, are provided between output and power source or drain terminals, and inductors are inserted into the source or drain legs of the power MOS FETs. With this arrangement, the power losses during switching in the output stage are very significantly reduced.

BRIEF DESCRIPTION OF DRAWINGS

FIG. 1 is a schematic diagram of a conventional power output stage of a pulse width modulation amplifier employing MOS FETs;

FIG. 2 is a graph showing characteristic curves of the MOS FETs employed in the circuit of FIG. 1;

FIGS. 3A to 3C are waveforms taken at various points in the circuit of FIG. 1;

FIGS. 7A and 7B show further waveforms of the circuit of FIG. 5;

FIG. 8 is a graph showing the efficiency and power loss in the output stage of the circuit of FIG. 5; and FIGS. 9 through 12 are schematic diagrams showing alternative preferred embodiments of the invention.

DESCRIPTION OF THE PREFERRED EMBODIMENTS

Figure 4:
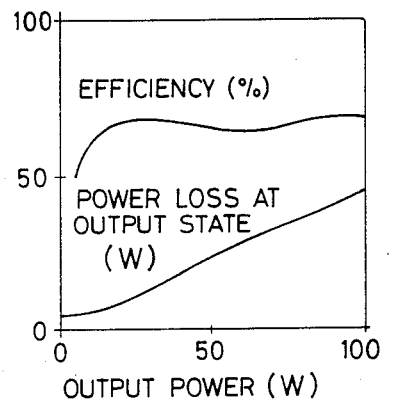
FIG. 4 is a graph showing the efficiency and power loss in the output stage of the amplifier circuit of FIG. 1.
Figure 5:
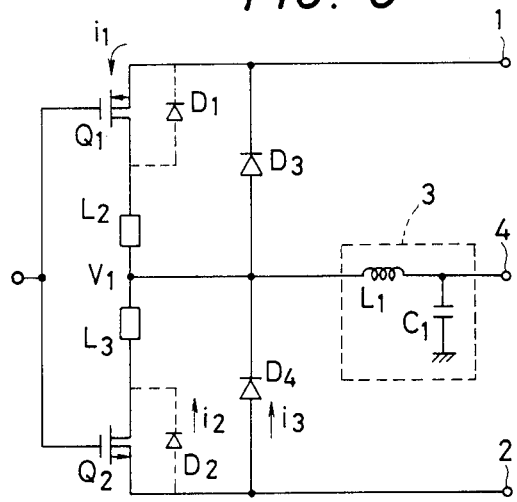
FIG. 5 is a schematic diagram of a power output stage constructed in accordance with the present invention.

Referring now to FIG. 5, a first embodiment of an output circuit of the present invention will be described. Reference numbers used in common in FIG. 5 and the following figures indicate like or similar components in FIG. 1.

As indicated in FIG. 5, the drains of each of the power MOS FETs $Q_1$ and $Q_2$ are connected through respective inductors $L_2$ and $L_3$ to the input of the low-pass filter 3. The cathode of a first high-speed diode $D_3$ is connected to the power source terminal 1 and the anode to the low-pass filter 3. Similarly, the anode of a second high-speed diode $D_4$ is connected to the power source terminal 2 and its cathode to the input of the low-pass filter 3. The inductances of the inductors $L_2$ and $L_3$ should be sufficiently small that the ordinary operation of the circuit is not affected. A typical value is 2 microhenries. Inductors $L_2$ and $L_3$ may be bead-core type inductors. For the diodes $D_3$ and $D_4$, the reverse recovery time should be small, preferably, below several decades of nanoseconds.

Figure 6A:
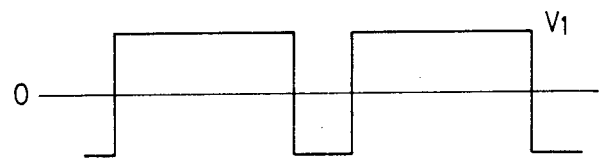
FIGS. 6A to 6C show waveforms taken at various points in the circuit of FIG. 5.
Figure 6B:
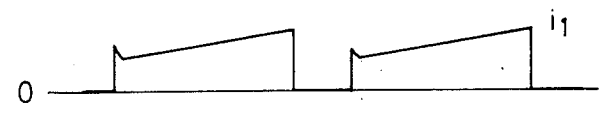
Figure 6C:
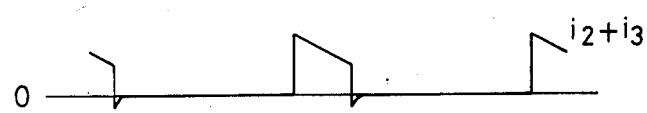

FIGS. 6A through 6C are waveform diagrams showing the voltage $V_1$, the current $i_1$, and the current $i_2+i_3$ composed of the currents flowing in the diodes $D_2$ and $D_4$. FIGS. 7A and 7C show, on an enlarged scale, the waveforms of the currents $i_2$ and $i_3$, respectively.

When the MOS FET $Q_1$ is not conducting, that is, when the current $i_1$ is 0, the currents $i_2$ and $i_3$ flow through the diodes $D_2$ and $D_4$, respectively. At the instant that the currents $i_2$ and $i_3$ start to flow, the current $i_3$ makes up substantially the entire sum. The current $i_3$ gradually falls off while the current $i_2$ increases. This is due to the fact that, upon build-up of the current $i_2$, the voltage across the inductor $L_3$ is reduced, whereupon the voltage drop across the diodes $D_2$ is reduced. When the MOS FET $Q_1$ starts to conduct, the voltage $V_1$ increases to a potential near that of the positive power source terminal. When the MOS FET $Q_1$ starts to conduct, a reverse voltage is instantaneously imposed across the diode $D_4$, and the forward current therethrough is cut off. However, since the diode $D_4$ is a high-speed diode, the time needed to switch between forward and reverse flows is short and the reverse current is small. The current of the diode $D_2$ changes more slowly because of the inductor $L_3$ connected in series with the MOS FET $Q_2$, and hence the reverse current through the diode $D_2$ is limited, as indicated by the FIGS. 7A and 7B. As a result, the sum of the reverse currents $i_2$ and $i_3$ is maintained very small, as can be seen from FIG. 6C. That is, the current flow from the positive power source terminal, through the MOS FET $Q_1$, the diode $D_2$, and the diode $D_4$ to the negative power source terminal is greatly reduced compared with the conventional circuit.

FIG. 8 shows graphically the efficiency and power loss of the circuit of FIG. 5. As FIG. 5 demonstrates, the efficiency of the circuit is improved and the power loss in the output stage considerably reduced compared with the prior approach.

As described above, power MOS FETs are used for switching elements in an output stage, but the present invention is not limited to a circuit using such devices. Also, it is possible to insert the inductors $L_2$ and $L_3$ in the source legs of the devices while attaining the same effects as in the above-described embodiment.

In an embodiment shown in FIG. 9, the switching elements are both implemented with N-channel FETs. In that circuit, the inductors are connected in series with the sources of the two devices.

Figure 10:
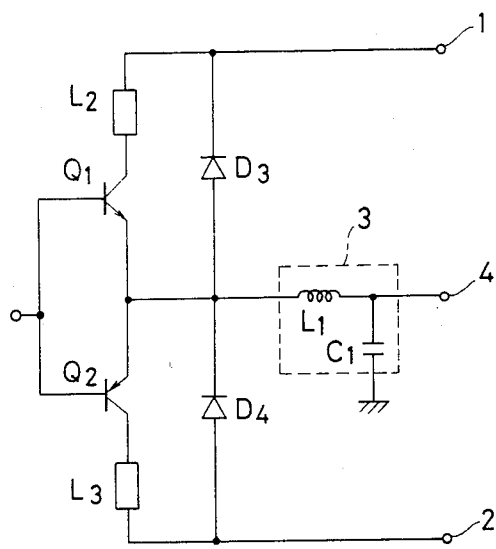
Figure 11:
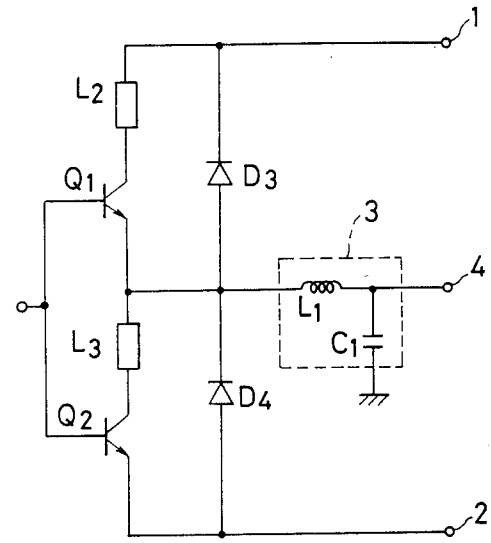
Figure 12:
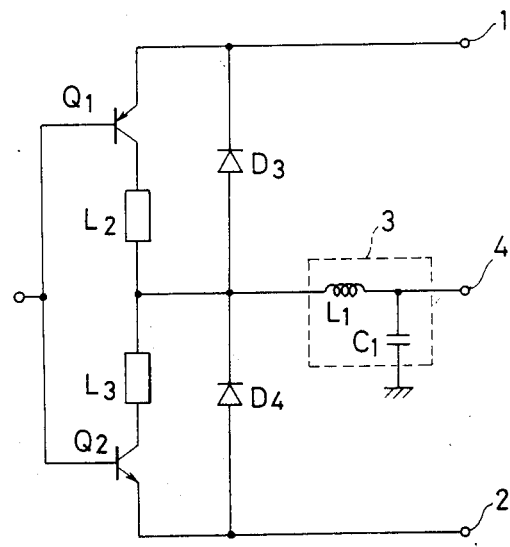

Still further, it is possible to employ a unidirectional switching elements such as bipolar transistors while obtaining the same effects. Such embodiments are illustrated in FIGS. 10 to 12, which are self-explanatory.

Although the invention has been described above with reference to the case of pulse width modulation power amplifier, the present invention can be applied as well to high-speed switching circuits.

This completes the description of the preferred embodiments of the invention. Although preferred embodiments have been described, it is believed that numerous modifications and alterations thereto will be apparently one of ordinary skills in the art without departing from the spirit and scope of the invention.

I claim:

1. An output circuit comprising:
   first and second switching elements, said first switching element having a first signal channel terminal coupled to a positive power source terminal and a second signal channel terminal coupled to an intermediate terminal, said second switching element having a first signal channel terminal coupled to a negative power source terminal and a second signal channel terminal coupled to said intermediate terminal, and said first and second switching elements having respective control terminals receiving control signals, said intermediate terminal providing an output signal;
   a first inductor coupled in series with the signal channel of said first switching element between said positive power source terminal and said intermediate terminal;
   a second inductor coupled in series with the signal channel of said second switching element between said intermediate terminal and said negative power source terminal;
   a first diode connected in parallel with the series coupling of said first transistor and said first inductor and having its anode coupled to said intermediate terminal and its cathode coupled to said positive power source terminal; and
   a second diode connected in parallel with the series coupling of said second transistor and said second inductor and having its cathode coupled to said intermediate terminal and its anode coupled to said negative power source terminal;
   whereby power loss occurring at switching times of said control signals is reduced.

2. The output circuit of claim 1, therein said switching elements comprise power MOS FETs.

3. The output circuit of claim 1, where said switching elements comprise bidirectional switching elements.

4. The output circuit of claim 1, wherein inductances of said inductors are no greater than 2 microhenries.

5. The output circuit of claim 1, further comprising low pass filter means connected to said intermediate terminal for filtering said output signal and providing a filtered output signal, whereby said output circuit suppresses a reverse current of said low pass filter means.

* * * * *